United States Patent
Wang et al.

(10) Patent No.: US 8,604,687 B2
(45) Date of Patent: Dec. 10, 2013

(54) ORGANIC LIGHT EMITTING DIODE DISPLAY DEVICE AND MANUFACTURING METHOD THEREOF

(75) Inventors: Wen-Chun Wang, Taichung (TW); Sherry Lin, Pingtung (TW); Chih-Jung Teng, Taichung (TW); Chun-Chin Chang, Tanzih Township, Taichung County (TW)

(73) Assignee: Wintek Corporation, Taichung (TW)

( * ) Notice: Subject to any disclaimer, the term of this patent is extended or adjusted under 35 U.S.C. 154(b) by 1085 days.

(21) Appl. No.: 12/582,908

(22) Filed: Oct. 21, 2009

(65) Prior Publication Data

US 2010/0097296 A1 Apr. 22, 2010

Related U.S. Application Data

(60) Provisional application No. 61/107,409, filed on Oct. 22, 2008.

(51) Int. Cl.
*H01L 51/00* (2006.01)

(52) U.S. Cl.
USPC .......................................... 313/504; 313/512

(58) Field of Classification Search
USPC ................................................. 313/498–512
See application file for complete search history.

(56) References Cited

U.S. PATENT DOCUMENTS

| | | | |
|---|---|---|---|
| 6,175,345 B1 * | 1/2001 | Kuribayashi et al. | 345/76 |
| 2001/0026127 A1 * | 10/2001 | Yoneda et al. | 313/506 |
| 2005/0139839 A1 | 6/2005 | Park | |
| 2005/0179368 A1 * | 8/2005 | Ryu et al. | 313/504 |
| 2006/0250073 A1 * | 11/2006 | Yamazaki et al. | 313/500 |
| 2007/0123135 A1 | 5/2007 | Yang et al. | |
| 2008/0116787 A1 | 5/2008 | Hsu et al. | |

FOREIGN PATENT DOCUMENTS

| | | |
|---|---|---|
| CN | 100423318 | 7/2005 |
| TW | 200806976 | 2/2008 |
| TW | 200824114 | 6/2008 |

OTHER PUBLICATIONS

Chinese language office action dated Oct. 26, 2010.
Taiwanese language office Action dated Oct. 18, 2012.
English language translation of abstract of TW 200806976 (published Feb. 1, 2008).
English language translation of abstract of TW 200824114 (published Jun. 1, 2008).
English language translation of abstract of CN 100423318 (published Jul. 13, 2005).

* cited by examiner

*Primary Examiner* — Anne Hines
(74) *Attorney, Agent, or Firm* — McClure, Qualey & Rodack, LLP

(57) ABSTRACT

An organic light emitting diode (OLED) display device including an active array substrate, a display substrate and several conductive members is provided. The active array substrate includes a first substrate and several thin film transistors. The thin film transistors are disposed on the first substrate so as to form an array. The display substrate includes a second substrate, a color filter layer, a first electrode layer, an organic material layer and a second electrode layer disposed sequentially. The second substrate is disposed in parallel to the first substrate. The organic material layer is used for emitting white light and includes several lighting structures electrically insulated from each other. The second electrode layer includes several electrode structures electrically insulated from each other. Each of the conductive members electrically connects to a drain of one corresponding thin film transistor and one corresponding electrode structure.

6 Claims, 4 Drawing Sheets

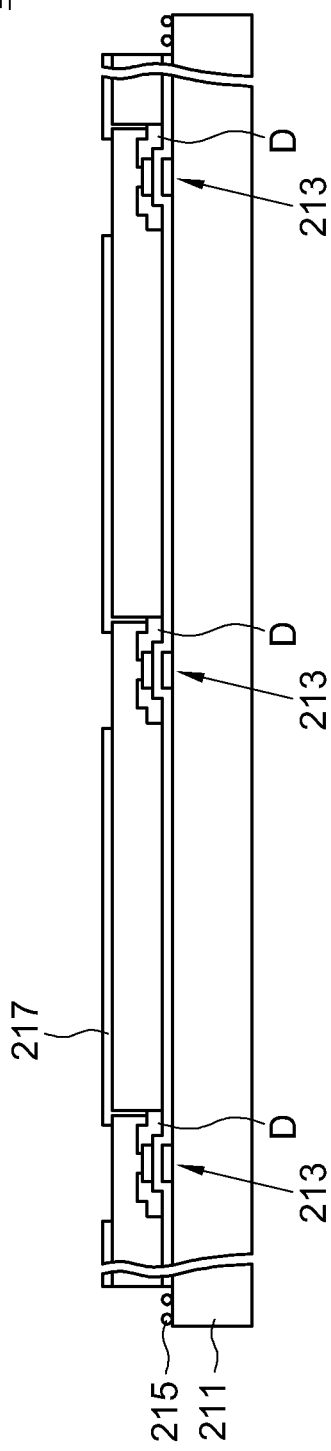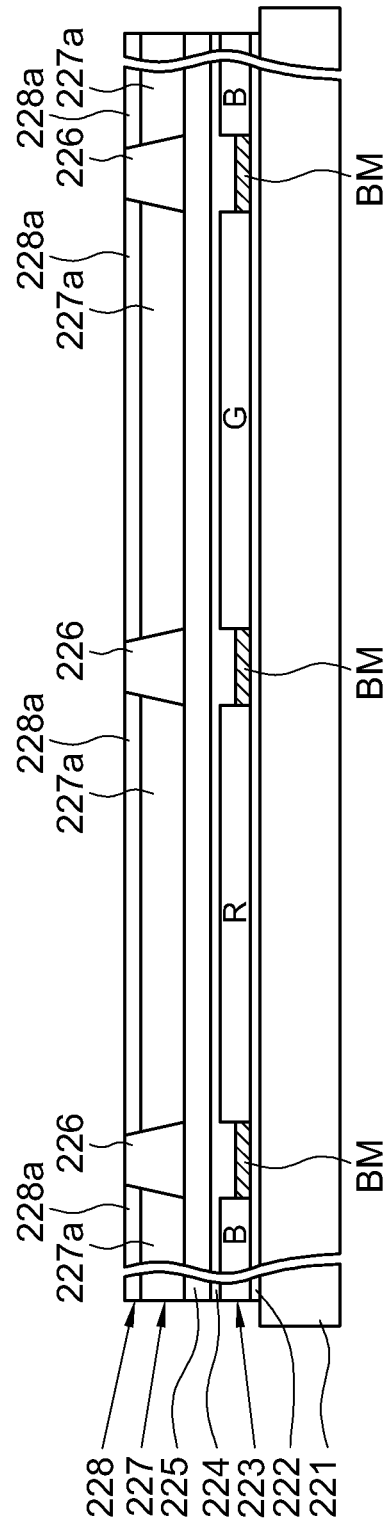

ORGANIC LIGHT EMITTING DIODE DISPLAY DEVICE AND MANUFACTURING METHOD THEREOF

This application claims the benefit of U.S. Provisional Application Ser. No. 61/107,409, filed Oct. 22, 2008, the subject matter of which is incorporated herein by reference.

BACKGROUND OF THE INVENTION

1. Field of the Invention

The invention relates in general to an organic light emitting diode (OLED) display device and a manufacturing method thereof, and more particularly to an OLED display device having two substrates and a manufacturing method thereof.

2. Description of the Related Art

Organic light emitting diode (OLED) display devices can be divided into the bottom emission type, the top emission type and the inverted top emission type according to the light emitting direction and structure. The bottom emission type OLED display device includes a bottom substrate, an anode, an organic material layer, a cathode and a top substrate sequentially disposed. As the light emitted by the organic material layer of the bottom emission type OLED display device passes through the bottom substrate on which several thin film transistors are disposed, the aperture ratio of the bottom emission type OLED display device decreases due to the blockage of the thin film transistors.

To avoid the decrease in the aperture ratio, the top emission type OLED display device further includes a reflection layer disposed on the anode, and the cathode is made of a light-pervious material. Thus, the light emitted by the organic material layer of the top emission type OLED display device can be reflected by the reflection layer, so that the light is projected towards the top substrate in which no thin film transistor is disposed, hence avoiding the decrease in the aperture ratio. However, a cathode made of a light-pervious material often has an inferior electron injection effect which further affects the display effect.

In addition, the top emission type OLED display device is a cathode common structure, wherein the anode of the top emission type OLED display device is electrically connected to the thin film transistors. When the voltage applied to the cathode common OLED display device increases, the driving voltage of the thin film transistors is affected to become unstable. The inverted top emission type OLED display device is an anode common structure, wherein the cathode of the inverted top emission type OLED display device is electrically connected to the thin film transistors. The inverted top emission type OLED display device, being an anode common structure, can avoid the driving voltage of the thin film transistors being affected by the voltage applied to the OLED display device. However, the anode of the inverted top emission type OLED display device needs to be formed on the organic material layer by way of sputtering. As a result, the organic material layer may be sputtered and damaged during the manufacturing process, hence affecting the light emitting effect.

SUMMARY OF THE INVENTION

The invention is directed to an organic light emitting diode (OLED) display device and a manufacturing method thereof. An active array substrate and a display substrate are respectively formed and assembled together to form an OLED display device.

According to a first aspect of the present invention, an OLED display device including an active array substrate, a display substrate and several conductive members is provided. The active array substrate includes a first substrate and several thin film transistors. The thin film transistors are disposed on the first substrate so as to form an array. The display substrate includes a second substrate, a color filter layer, a first electrode layer, an organic material layer and a second electrode layer. The second substrate is disposed in parallel to the first substrate. The color filter layer is disposed on the second substrate and has several color blocks. The first electrode layer is disposed on the color filter layer. The organic material layer is disposed on the first electrode for emitting white light. The organic material layer includes several light-emitting structures electrically insulated from each other. The second electrode layer is disposed on the organic material layer and includes several electrode structures electrically insulated from each other. Each of the conductive members electrically connects to a drain of one corresponding thin film transistor and one corresponding electrode structure. Each of the thin film transistors corresponds to one of the color blocks, one of the light-emitting structures and one of the electrode structures.

According to a second aspect of the present invention, a manufacturing method of an OLED display device including the following steps is provided. An array having several thin film transistors is formed on a first substrate so as to form an active array substrate. Next, a color filter layer, a first electrode layer, an organic material layer and a second electrode layer are sequentially formed on a second substrate so as to form a display substrate, wherein the organic material layer is used for emitting white light. Then, the active array substrate and the display substrate are combined and electrically connected through several conductive members so as to form an OLED display device.

The invention will become apparent from the following detailed description of the preferred but non-limiting embodiments. The following description is made with reference to the accompanying drawings.

BRIEF DESCRIPTION OF THE DRAWINGS

FIG. 1A shows a sectional view of an active array substrate according to a preferred embodiment of the present invention.

FIG. 1B shows a sectional view of a display substrate according to a preferred embodiment of the present invention.

DETAILED DESCRIPTION OF THE INVENTION

Figure 1C:
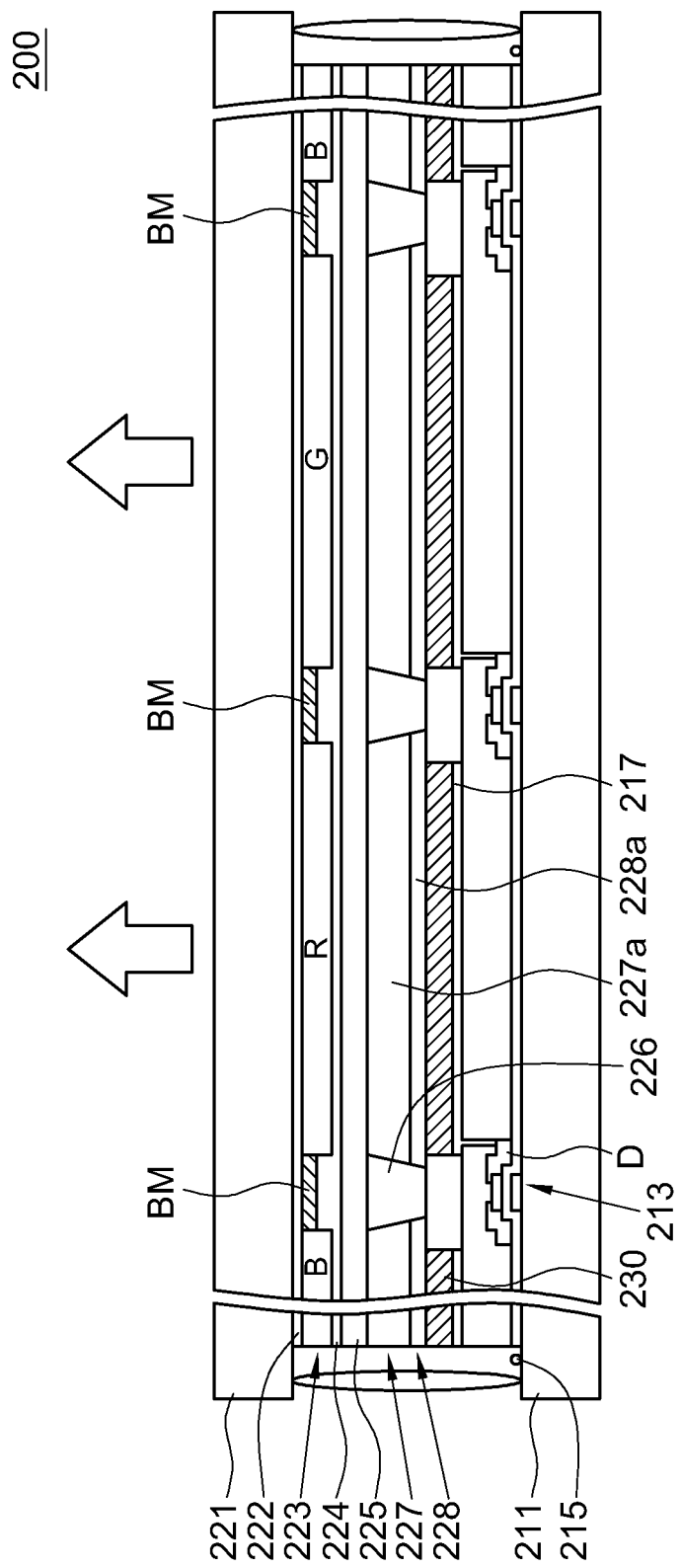
FIG. 1C shows a sectional view of an OLED display device assembled by the active array substrate in FIG. 1A and the display substrate in FIG. 1B.

Referring to FIGS. 1A~1C, a sectional view of an active array substrate according to a preferred embodiment of the present invention is shown in FIG. 1A, a sectional view of a display substrate according to a preferred embodiment of the present invention is shown in FIG. 1B, and a sectional view of an OLED display device assembled by the active array substrate in FIG. 1A and the display substrate in FIG. 1B is shown in FIG. 1C. The organic light emitting diode (OLED) display device 200 includes an active array substrate 210, a display substrate 220 and several conductive members 230.

As indicated in FIG. 1A, the active array substrate 210 includes a first substrate 211 and several thin film transistors (TFT) 213. The thin film transistors 213 are disposed on the first substrate 211 so as to form an array.

As indicated in FIG. 1B, the display substrate 220 includes a second substrate 221, a color filter layer 223, a first electrode layer 225, an organic material layer 227 and a second electrode layer 228. The second substrate 221 and the first substrate 211 are disposed in parallel and correspond to each other. The color filter layer 223, the first electrode layer 225, the organic material layer 227 and the second electrode layer 228 are disposed on the second substrate 221 sequentially. The color filter layer 223 has several color blocks. The organic material layer 227 is used for emitting white light and includes several light-emitting structures 227a electrically insulated from each other. The second electrode layer 228 includes several electrode structures 228a electrically insulated from each other. Each of the thin film transistors 213 corresponds to one color block, one light-emitting structure 227a and one electrode structure 228a.

As indicated in FIG. 1C, each of the conductive members 230 is combined and electrically connected to a drain D of one corresponding thin film transistor 213 and one corresponding electrode structure 228a. Compared with an OLED display device with a top substrate which is merely used for packaging or blocking mist, the second substrate 221 is further used as a structure which provides a full-color frame. More specifically, the white light emitted by the organic material layer 227 can become full-color by passing through the color filter layer 223 disposed on the second substrate 221. Therefore, colorization is made easier, the resolution level is improved, the material cost is reduced, and the yield rate is increased.

In addition, as the organic material layer 227 emits the light towards the second substrate 221 without being disposed with the thin film transistors 213 thereon, the aperture ratio of the OLED display device 200 can be increased to avoid being decreased due to the blockage by the thin film transistors 213. Furthermore, the thin film transistors 213 or other compensation circuits can be flexibly disposed on the first substrate 211 without considering the aperture ratio, hence reducing manufacturing cost and time.

Generally speaking, an anode of an OLED display device being a cathode common structure is electrically connected to thin film transistors. If the driving voltage of the OLED display device being a cathode common structure intends to have a target current, the driving voltage of the thin film transistors is affected and becomes unstable, so that the voltage is hard to control. In contrast, the drain D of the thin film transistor 213 is directly connected to the cathode (the electrode structure 228a) of the display substrate 220, so the voltage of the thin film transistor 213 can be operated without being affected by the display substrate 220. Thus, under the same driving conditions, the OLED display device 200 can have higher brightness and contrast and superior image performance accordingly.

Furthermore, as the conventional top emission type OLED display device needs to be disposed with a transparent electrode layer by an inverted manufacturing process, the organic layer of the conventional top emission type OLED display device may be damaged during the formation of an electrode layer. In contrast, it does not need to sputter an electrode layer on the organic layer of the OLED display device 200 of the present embodiment of the invention, so the condition that the organic layer is damaged can be avoided, and the cost for forming the electrode layer is saved.

According to the present embodiment of the invention, the active array substrate 210 and the display substrate 220 can be manufactured separately, and then combined and electrically connected through the conductive members 230 to form the OLED display device 200. Thus, the active array substrate 210 and the display substrate 220 can be tested in advance to detect defected substrates so as to increase the yield rate of the assembled OLED display device 200.

The OLED display device 200 is further elaborated below. In terms of the active array substrate 210, the thin film transistors 213 can be poly crystalline silicon, microcrystalline silicon or amorphous silicon thin film transistors. In addition, the OLED display device 200 may further include several desiccant dryers 215 distributed on the first substrate 211 to avoid mist or oxygen damaging internal components of the OLED display device 200.

In terms of the display substrate 220, the display substrate 220 may further include an auxiliary electrode 222, a passivation layer 224 and several electrical blockers 226. The layers of the display substrate 220 are sequentially disposed on the second substrate 221 in the order of the auxiliary electrode 222, the color filter layer 223, the passivation layer 224, the first electrode layer 225, the organic material layer 227 and the second electrode layer 228. Each electrical blocker 226 is located between two adjacent light-emitting structures 227a and between two adjacent electrode structures 228a. The layers of the display substrate 220 are further elaborated below.

The auxiliary electrode 222 can be meshed or bar-shaped. The auxiliary electrode 222 can be made of molybdenum (Mo) or chromium (Cr), or the auxiliary electrode 222 can be a Mo/Al/Mo stack structure, wherein Al denotes aluminum. Compared with a display device whose OLED structure is directly connected to thin film transistors, as the OLED display device 200 is disposed with the auxiliary electrode 222, the anode (the first electrode layer 225) has lower impedance so as to enhance the light-emitting uniformity.

The color filter layer 223 includes several red color blocks R, blue color blocks B, green color blocks G for example, but the color filter layer 223 is not limited to have the above three colors. Each of the color blocks is used for making the light passing therethrough show the color thereof, so that the OLED display device 200 is capable of displaying a full-color frame. In addition, a black matrix BM is disposed so as to avoid the light leakage occurring to adjacent sub-pixels. The thickness of the black matrix BM can be the same with or different from that of the color block.

The passivation layer 224 is made of silicon dioxide ($SiO_2$), for example. The passivation layer 224 is used for protecting the color blocks and the black matrix BM and filling up the difference in thickness between the color blocks and the black matrix BM so as to provide a flat surface. In addition, the first electrode layer 225 is made of indium tin oxide (ITO), for example, and is used for being the anode.

The organic material layer 227 may be a single layer or a multi-layered stack structure. The multi-layered stack structure is composed of multiple materials. More specifically, each light-emitting structure 227a of the organic material layer 227 includes a hole transport layer (HTL), an emitting material layer (EML) and an electron transport layer (ETL). The adjacent light-emitting structures 227a are electrically insulated from each other by one electrical blocker 226. When a voltage is applied to the organic material layer 227, the electrons and the holes pass through the electron transport layer and the hole transport layer respectively so as to form excitons in the emitting material layer. The excitons having high energy release the energy by emitting color light according to the material characteristics of the emitting material layer. Here, the organic material layer 227 emits white light whose CIE coordinates are, for example, (0.33, 0.33).

The second electrode layer 228 is made of aluminum and is used as a cathode. The adjacent electrode structures 228a of the second electrode layer 228 are electrically insulated from each other by one electrical blocker 226.

The active array substrate 210 and the display substrate 220 are assembled by the conductive members 230. In the present embodiment of the invention, each conductive member 230 is combined and electrically connected to and the drain D of the corresponding thin film transistor 213 and the corresponding electrode structure 228a through a conductive layer 217, a conductive protrusion or a conductive bump (not shown in FIG. 1A) etc. The conductive layer 217, the conductive protrusion and the conductive bump can be made of metal or indium tin oxide, for example. Moreover, each conductive member 230 is made of a material with good conductivity, such as conductive spacers, anisotropic conductive films, anisotropic conductive adhesives, conductive adhesives, conductive resins, silver paste or metal bumps. In addition, the thickness of the conductive members 230 can approximately range between 5~1000 nm, and is preferably 150 nm. Preferably, the work function of each conductive member 230 ranges between the work function of the drain D of each thin film transistor 213 and the work function of each electrode structure 228a so as to reduce the contact problem which occurs due to the electron mobility between difference interfaces. Besides, in the present embodiment of the invention, the conductive members 230 can be used for controlling the predetermined gap between the active array substrate 210 and the display substrate 220 and used as a thinned buffer layer to reduce the deterioration of components when the OLED display device 200 is pressed.

Figure 2:
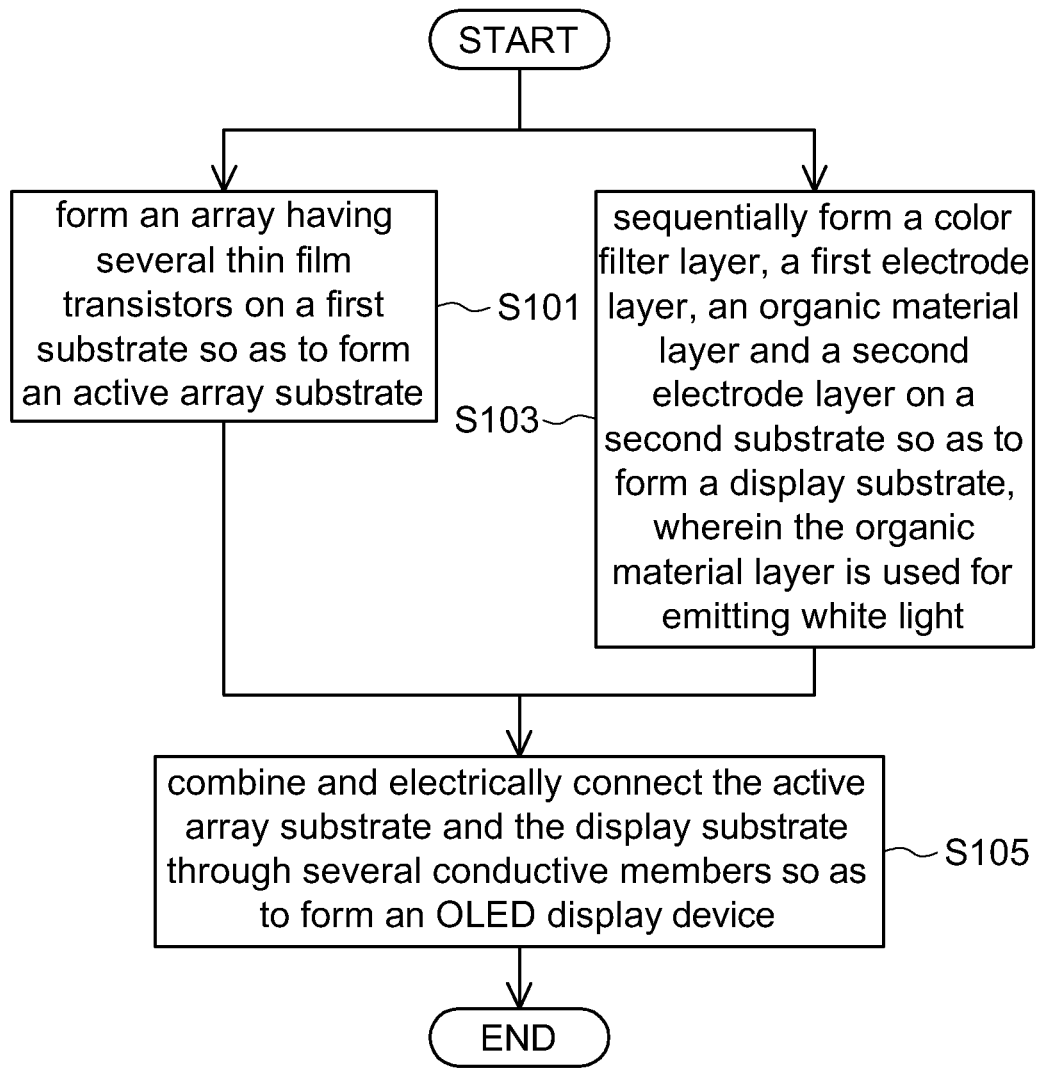
FIG. 2 shows a flowchart of a manufacturing method of an OLED display device according to a preferred embodiment of the present invention.

Referring to FIG. 2, a flowchart of a manufacturing method of an OLED display device according to a preferred embodiment of the present invention is shown. In the step S101, the array having several thin film transistors 213 is formed on the first substrate 211 so as to form the active array substrate 210, as indicated in FIG. 1A. Next, in the step S103, the color filter layer 223, the first electrode layer 225, the organic material layer 227 and the second electrode layer 228 are sequentially formed on the second substrate 221 so as to form the display substrate 220, as indicated in FIG. 1B. The organic material layer 227 is used for emitting white light. The steps S101 and S103 can be performed concurrently to save manufacturing time.

Then, in the step S105, the active array substrate 210 in FIG. 1A and the display substrate 220 in the FIG. 1B are combined and electrically connected through several conductive members 230 so as to form the OLED display device 200, as indicated in FIG. 1C. In the present embodiment of the invention, the drain D of the corresponding thin film transistor 213 and the corresponding electrode structure 228a are combined and electrically connected by the conductive members 230 so as to form the OLED display device 200 in the step S105. Each conductive member 230 can provide the combination function by way of UV light radiation, thermosetting or heat press fitting. If UV light radiation is selected to set the conductive members 230, only a small portion of the light-pervious area of the second substrate 221 needs to be reserved for the UV light to pass through to set the conductive members 230.

Figure 3:
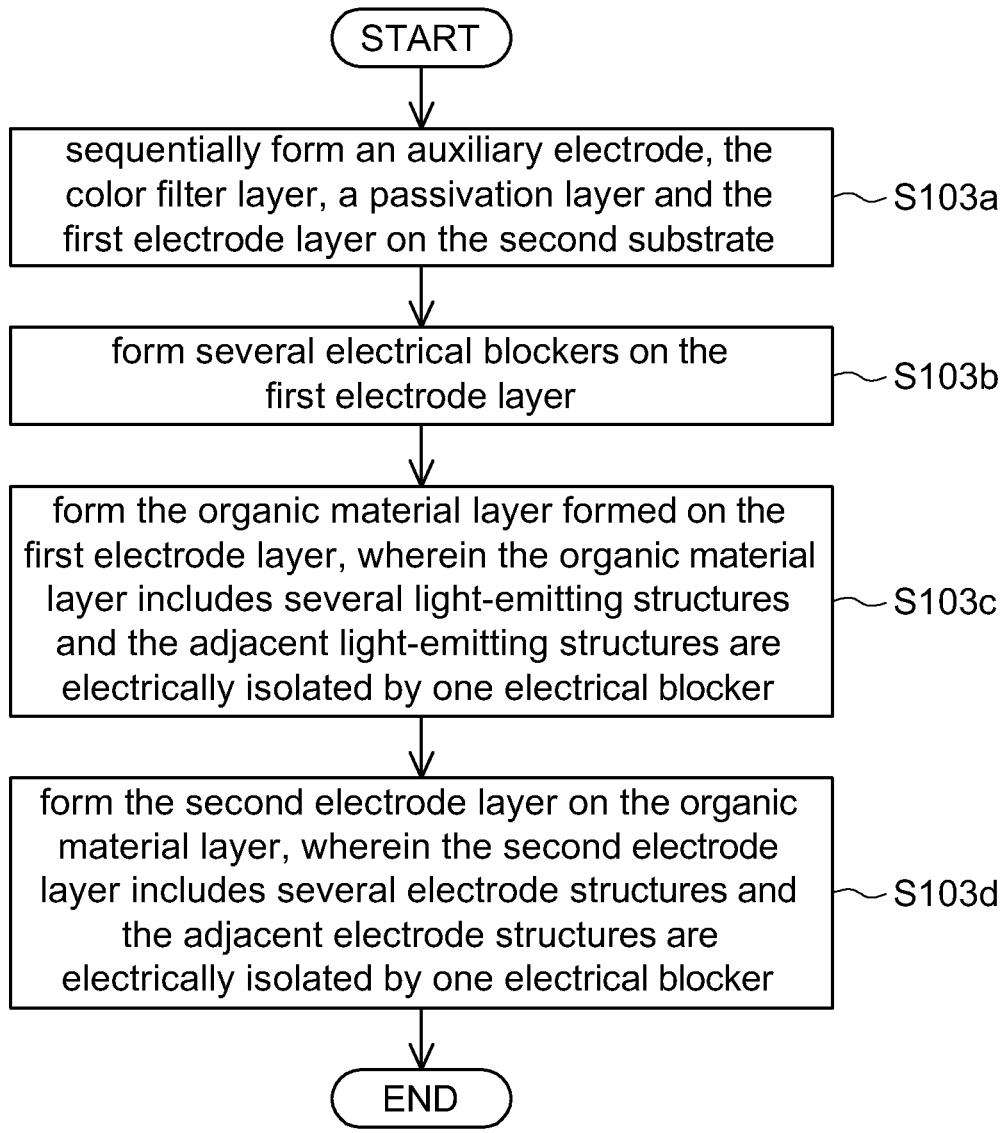
FIG. 3 shows a flowchart of a manufacturing method of the display substrate in FIG. 2.

The step S103 includes the steps S103a~S103d in FIG. 3, for example. In the step S103a, the auxiliary electrode 222, the color filter layer 223, the passivation layer 224 and the first electrode layer 225 are sequentially formed on the second substrate 221. Next, in the step S103b, several electrical blockers 226 are formed on the first electrode layer 225 for electrically isolating the adjacent light-emitting structures 227a of the organic material layer 227 and the adjacent electrode structures 228a of the second electrode layer 228 formed in subsequent steps. Therefore, the short circuit condition can be avoided. Then, in the step S103c, the organic material layer 227 is formed on the first electrode layer 225. After that, in the step S103d, the second electrode layer 228 is formed on the organic material layer 227 so as to form the display substrate 220.

According to the OLED display device and the manufacturing method thereof disclosed in the above embodiments of the invention, the active array substrate and the display substrate are respectively formed, and then assembled to form the OLED display device. Thus, the active array substrate and the display substrate can be tested in advanced to detect defected substrates so as to increase the yield rate of the assembled OLED display device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display device, comprising:
    an active array substrate, comprising:
        a first substrate; and
        a plurality of thin film transistors disposed on the first substrate so as to form an array;
    a display substrate, comprising:
        a second substrate disposed in parallel to the first substrate;
        a color filter layer disposed on the second substrate and having a plurality of color blocks;
        a first electrode layer disposed on the color filter layer;
        an organic material layer disposed on the first electrode layer for emitting white light, wherein the organic material layer comprises a plurality of light-emitting structures electrically insulated from each other; and
        a second electrode layer disposed on the organic material layer and comprising a plurality of electrode structures electrically insulated from each other; and
    a plurality of conductive members, wherein each of the conductive members electrically connects to a drain of one corresponding thin film transistor and one corresponding electrode structure;
    wherein, each of the thin film transistors corresponds to one of the color blocks, one of the light-emitting structures and one of the electrode structures;
    wherein a work function of each of the conductive members ranges between the work function of the drain of each of the thin film transistors and the work function of each of the electrode structures, and the organic material layer is a multi-layered stack structure.

2. The OLED display device according to claim 1, wherein the active array substrate further comprises:
    a plurality of desiccant dryers distributed on the first substrate.

3. The OLED display device according to claim 1, wherein the display substrate further comprises:
    an auxiliary electrode disposed between the second substrate and the color filter layer, wherein the auxiliary electrode is either meshed or bar-shaped.

4. The OLED display device according to claim 1, wherein the display substrate further comprises:
   a passivation layer disposed between the color filter layer and the first electrode layer.

5. The OLED display device according to claim 1, wherein the display substrate further comprises:
   a plurality of electrical blockers disposed on the first electrode layer, wherein each of the electrical blockers is located between the two adjacent light-emitting structures and between the two adjacent electrode structures.

6. A manufacturing method of an OLED display device, comprising:
   forming an array having a plurality of thin film transistors on a first substrate so as to form an active array substrate;
   sequentially forming a color filter layer, a first electrode layer, an organic material layer and a second electrode layer on a second substrate so as to form a display substrate, wherein the organic material layer is used for emitting white light; and
   combining and electrically connecting the active array substrate and the display substrate through a plurality of conductive members so as to form an OLED display device;
   wherein the second electrode layer comprising a plurality of electrode structures electrically insulated from each other; and
   wherein the work function of each of the conductive members ranges between the work function of the drain of each of the thin film transistors and the work function of each of the electrode structures, and the organic material layer is a multi-layered stack structure.

* * * * *